United States Patent
Maeda

(10) Patent No.: US 9,196,774 B2
(45) Date of Patent: Nov. 24, 2015

(54) SOLAR MODULE AND METHOD FOR MANUFACTURING THE SAME

(71) Applicant: SANYO ELECTRIC CO., LTD., Moriguchi, Osaka (JP)

(72) Inventor: Masanori Maeda, Kobe (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/247,482

(22) Filed: Apr. 8, 2014

(65) Prior Publication Data

US 2014/0216548 A1     Aug. 7, 2014

Related U.S. Application Data

(63) Continuation of application No. PCT/JP2012/053609, filed on Feb. 16, 2012.

(51) Int. Cl.
| | |
|---|---|
| *H02N 6/00* | (2006.01) |
| *H01L 31/042* | (2014.01) |
| *H01L 31/048* | (2014.01) |
| *H01L 31/18* | (2006.01) |
| *B32B 17/10* | (2006.01) |

(52) U.S. Cl.
CPC ...... *H01L 31/0481* (2013.01); *B32B 17/10018* (2013.01); *B32B 17/10788* (2013.01); *H01L 31/048* (2013.01); *H01L 31/18* (2013.01); *Y02E 10/50* (2013.01); *Y10T 156/10* (2015.01)

(58) Field of Classification Search
None
See application file for complete search history.

(56) References Cited

U.S. PATENT DOCUMENTS

| | | | |
|---|---|---|---|
| 6,204,443 B1 | 3/2001 | Kiso et al. | |
| 6,762,508 B1 * | 7/2004 | Kiso et al. | 257/787 |
| 2003/0006730 A1 | 1/2003 | Tachibana | |
| 2004/0229404 A1 | 11/2004 | Kiso et al. | |
| 2005/0115603 A1 * | 6/2005 | Yoshida et al. | 136/251 |
| 2007/0227584 A1 * | 10/2007 | Tsunomura et al. | 136/251 |
| 2011/0303276 A1 | 12/2011 | Fujii | |
| 2013/0133725 A1 | 5/2013 | Nakatani | |

FOREIGN PATENT DOCUMENTS

| | | |
|---|---|---|
| EP | 0939441 A2 | 9/1999 |
| EP | 2600419 A1 | 6/2013 |
| JP | S61-133674 A | 6/1986 |
| JP | H09-153635 A | 6/1997 |
| JP | 2005-050928 A | 2/2005 |
| JP | 2011-171400 A | 8/2010 |
| WO | 2012/015031 A1 | 2/2012 |

* cited by examiner

*Primary Examiner* — Eli Mekhlin
(74) *Attorney, Agent, or Firm* — Marvin A. Motsenbocker; Mots Law, PLLC

(57) ABSTRACT

In a solar module of the present invention, the ratio (T2/T1) of a thickness (T2) of a rear surface-side filling material layer at the end surface to a thickness (T1) of a rear surface-side filling material layer in a region where a solar cell (22) is provided is set smaller than the ratio (T4/T3) of a thickness (T4) of a light receiving surface-side filling material layer at the end surface to a thickness (T3) of the light receiving surface-side filling material layer in a region where the solar cell is provided. Consequently, entry of water into a filling material layer from the end surface of the filling material layer is effectively suppressed, and improved humidity resistance is achieved.

6 Claims, 2 Drawing Sheets

SOLAR MODULE AND METHOD FOR MANUFACTURING THE SAME

CROSS REFERENCE TO RELATED APPLICATIONS

This application is a continuation application of International Application No. PCT/JP2012/053609, filed on Feb. 16, 2012, entitled "SOLAR CELL MODULE AND METHOD FOR MANUFACTURING THE SAME", the entire contents of which are incorporated herein by reference.

BACKGROUND ART

The invention relates to a solar module and a method of manufacturing the same.

As described in Patent Document 1, in a solar module, solar cells are sealed by a encapsulant. This prevents ingress of moisture into the solar cells, and consequently improves the moisture resistance of the solar module.

PRIOR ART DOCUMENT PATENT DOCUMENT 1: Japanese Patent Application Publication No. 2010-171400

SUMMARY OF THE INVENTION

There are increasing demands for further improvement in the moisture resistance of the solar module.

One aspect of the invention provides a solar module with improved moisture resistance and a method for manufacturing the same.

An embodiment of the solar module includes a solar cell and an encapsulant. The solar cell has a light-receiving surface and a back surface. The encapsulant seals the solar cell. The encapsulant includes a light-receiving surface side encapsulant and a back surface side encapsulant. The light-receiving surface side encapsulant is located on a light-receiving surface side of the solar cell. The back surface side encapsulant is located on a back surface side of the solar cell. A ratio of a thickness of the back surface side encapsulant at an end surface thereof to a thickness of the back surface side encapsulant at a region where the solar cell is provided ((the thickness of the back surface side encapsulant at the end surface thereof)/(the thickness of the back surface side encapsulant at the region where the solar cell is provided)) is smaller than a ratio of a thickness of the light-receiving surface side encapsulant at an end surface thereof to a thickness of the light-receiving surface side encapsulant at a region where the solar cell is provided ((the thickness of the light-receiving surface side encapsulant at the end surface thereof)/(the thickness of the light-receiving surface side encapsulant at the end surface thereof)).

An embodiment of the method for manufacturing a solar module includes a lamination step of pressing a stacked body under heat to fabricate the solar module, the stacked body being obtained by stacking a first resin sheet for forming the light-receiving surface material, the solar cell, and a second resin sheet for forming the back surface material in the order mentioned. A resin sheet used as the second resin sheet is a resin sheet whose fluidity under a temperature to which the laminate is heated in the lamination step is higher than that of the first resin sheet.

EFFECT OF THE INVENTION

The solar module and the method for manufacturing the same above can provide a solar module with improved moisture resistance.

EMBODIMENTS

Figure 1:
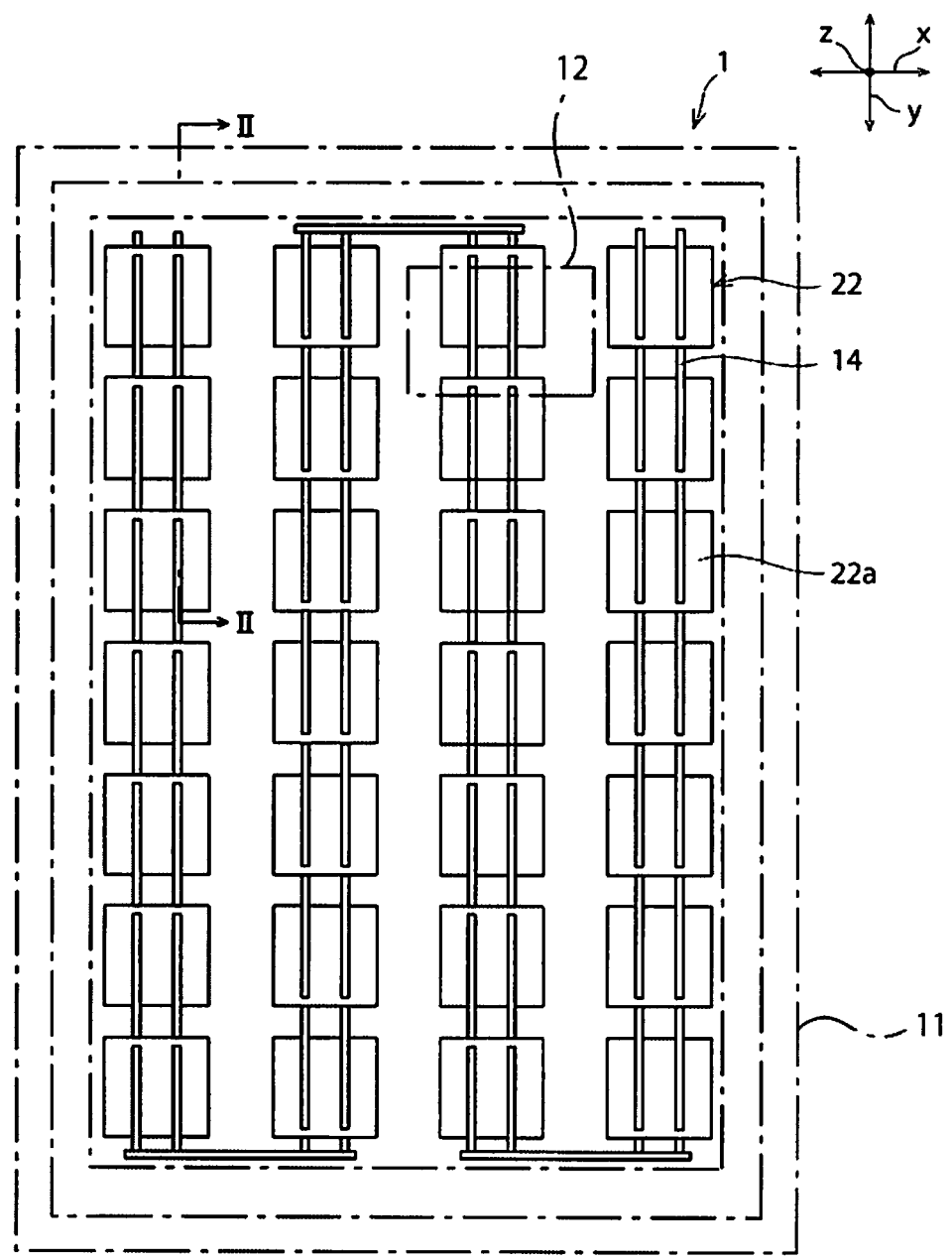
FIG. 1 is a schematic plan view of a solar module according to one embodiment of the invention.

Embodiments of the invention are described below. Note that the embodiment given below is a mere example. The invention is by no means limited to the embodiment below.

Throughout the drawings referred to in the embodiment and the like, materials having substantially the same functions are denoted by the same reference numeral. Moreover, the drawings referred to in the embodiment and the like are schematically illustrated, and dimensional ratios and the like of objects depicted in the drawings may be different from those of actual objects. Dimensional ratios and the like may differ from one drawing to another, as well. Specific dimensional ratios and the like of the objects should be determined in consideration of the following description.

Figure 2:
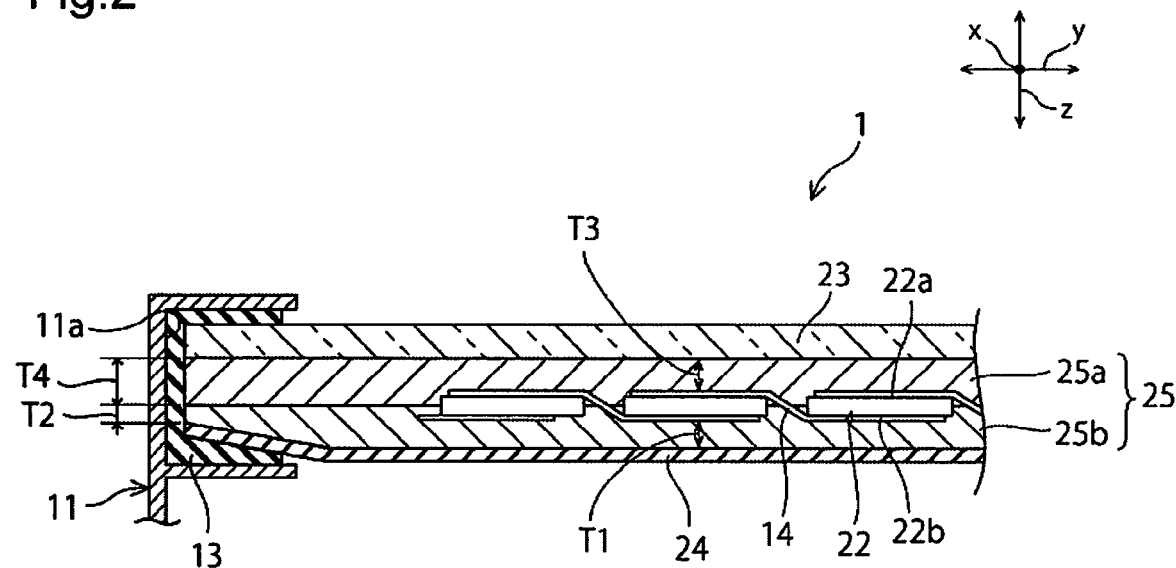
FIG. 2 is a schematic sectional view taken along line II-II in FIG. 1.

As illustrated in FIGS. 1 and 2, solar module 1 includes solar cells 22. Specifically, solar module 1 includes multiple solar cells 22 electrically connected via wiring materials 14. As illustrated in FIG. 2, each solar cell 22 has light-receiving surface 22a and back surface 22b. The "light-receiving surface" herein refers to a main surface mainly receiving light. Solar cell 22 may be one configured to generate power only when light-receiving surface 22a receives light, or one configured to generate power when any of light-receiving surface 22a and back surface 22b receives light.

Solar cells 22 are arranged inside encapsulant 25 and sealed by encapsulant 25. Encapsulant 25 is filled between light-receiving surface material 23 and back surface material 24.

Light-receiving surface material 23 is placed on the light-receiving surface 22a side of solar cells 22. Light-receiving surface material 23 is made of a rigid body substantially not having flexibility. Light-receiving surface material 23 can be made of, for example, glass or the like.

Back surface material 24 is placed on the back surface 22b side of solar cells 22. Back surface material 24 has flexibility. Back surface material 24 is made of, for example, a resin sheet or the like. Specifically, in this embodiment, back surface material 24 is made of a resin sheet containing no metal layer. Note that, as illustrated in FIG. 1, junction box 12 is placed on back surface material 24, junction box 12 having terminals to which solar cells 22 are electrically connected.

Frame 11 is provided outside encapsulant 25. Frame 11 is provided over the entire circumference of encapsulant 25 in such a manner as to surround encapsulant 25. Frame 11 has recessed portion 11a. A stacked body of encapsulant 25, light-receiving surface material 23, and back surface material 24 is inserted into this recessed portion 11a. Water stop material 13 (see FIG. 2) is filled in a gap between frame 11 and the stacked body of encapsulant 25, light-receiving surface material 23, and back surface material 24. Water stop 13 can be made of, for example, a silicone resin, a butyl rubber, or the like.

Encapsulant 25 has light-receiving surface side encapsulant 25a and back surface side encapsulant 25b. Light-receiving surface side encapsulant 25a is located on the light-receiving surface 22a side of solar cells 22. More specifically, light-receiving surface side encapsulant 25a is located between light-receiving surface material 23 and solar cells 22. Back surface side encapsulant 25b is located on the back surface 22b side of solar cells 22. More specifically, back surface side encapsulant 25b is located between back surface material 24 and back surface 22b of solar cells 22.

Back surface side encapsulant 25b contains a crosslinkable resin. Specifically, back surface side encapsulant 25b contains an ethylene-vinyl acetate copolymer (EVA). Light-receiving surface side encapsulant 25a contains a non-crosslinkable resin. Specifically, light-receiving surface side encapsulant 25a contains polyolefin such as, for example, polyethylene or polypropylene. Thus, the water vapor transmission rate of back surface side encapsulant 25b is higher than that of light-receiving surface side encapsulant 25a.

The crosslinkable resin may have a gel fraction of less than 50%. The "gel fraction" is measured by the following measurement method. One gram of resin to be measured is prepared. The resin is immersed in 100 ml of xylene for 24 hours under 120° C. Then, residues in the xylene is removed and dried for 16 hours under 80° C. Thereafter, the mass of the residues after being dried is measured. A gel fraction (%) is calculated based on the measurement result, according to Formula (1) given below.

(gel fraction (%))=(mass of residues (g))/mass of resin before immersion (g))    (1)

Encapsulant 25 preferably contains an ultraviolet absorber. In this case, it is preferably that the concentration of the ultraviolet absorber in light-receiving surface side encapsulant 25a be higher than that in back surface side encapsulant 25b. Back surface side encapsulant 25b may or may not contain the ultraviolet absorber. Concrete examples of an ultraviolet absorber preferably used include a benzotriazole-based ultraviolet absorber, a benzophenone-based ultraviolet absorber, a benzoate-based ultraviolet absorber, and the like.

Herein, T1 denotes the thickness of back surface side encapsulant 25b at a region where solar cells 22 are provided, T2 denotes the thickness of back surface side encapsulant 25b at an end surface thereof, T3 denotes the thickness of light-receiving surface side encapsulant 25a at a region where solar cells 22 are provided, and T4 denotes the thickness of light-receiving surface side encapsulant 25a at an end surface thereof.

In solar module 1, a ratio of the thickness (T2) of back surface side encapsulant 25b at the end surface thereof to the thickness (T1) of back surface side encapsulant 25b at the region where solar cells 22 are provided (i.e., T2/T1) is smaller than a ratio of the thickness (T4) of light-receiving surface side encapsulant 25a at the end surface thereof to the thickness (T3) of light-receiving surface side encapsulant 25a at the region where solar cells 22 are provided (i.e., T4/T3) ((T2/T1)<(T4/T3)). In other words, thickness T2 of back surface side encapsulant 25b at the end surface thereof is reduced. This effectively prevents ingress of moisture into encapsulant 25 from the end surface of encapsulant 25. Consequently, improved moisture resistance can be achieved.

If back surface side encapsulant 25b contains an ethylene-vinyl acetate copolymer (EVA) and light-receiving surface side encapsulant 25a contains polyolefin, the water vapor transmission rate of back surface side encapsulant 25b is higher than that of light-receiving surface side encapsulant 25a. Thus, moisture is likely to enter more from the end surface of back surface side encapsulant 25b than from the end surface of light-receiving surface side encapsulant 25a. Thus, reduction in thickness T2 of back surface side encapsulant 25b at the end surface thereof is particularly effective in preventing ingress of moisture from the end surface of back surface side encapsulant 25b.

From the viewpoint of preventing moisture ingress from the end surface of the encapsulant, it is conceivable to reduce both of the thickness of the light-receiving surface side encapsulant at the end surface thereof and the thickness of the back surface side encapsulant at the end surface thereof. In such a case, however, the overall thickness of the encapsulant at an end surface of the solar module might become too thin. For this reason, ultraviolet light incident on the light-receiving surface might reach the back surface material, making the back surface material more likely to deteriorate due to the ultraviolet light. Particularly when the back surface material is made of a resin sheet, the back surface material is likely to deteriorate due to ultraviolet light. If the back surface material deteriorates, the water vapor transmission rate of the back surface material increases. As a result, the moisture resistance of the solar module easily deteriorates with time. Further, from the viewpoint of preventing moisture ingress from the end surface of the filing material layer, it is conceivable to reduce not the thickness of the back surface side encapsulant at the end surface thereof, but the thickness of the light-receiving surface side encapsulant at the end surface thereof. However, in a case where, for example, the concentration of the ultraviolet absorber in the light-receiving surface side encapsulant is higher than that in back surface side encapsulant, it is difficult to sufficiently suppress ultraviolet light reaching the back surface material. Hence, it is difficult to sufficiently suppress aging deterioration of the moisture resistance of the solar module.

If the thickness of the back surface side encapsulant is large at the end surface thereof with the water vapor transmission rate of the back surface side encapsulant being higher than that of light-receiving surface side encapsulant, it is difficult to sufficiently prevent ingress of moisture into the solar module from the end surface of the back surface side encapsulant. Thus, moisture resistance cannot be improved sufficiently. In contrast, in solar module 1, thickness T2 of the end surface of back surface side encapsulant 25b having a relatively high water vapor transmission rate is reduced. Thus, ingress of moisture into solar module 1 from the end surface of encapsulant 25 can be effectively prevented, which allows achievement of improved moisture resistance. Further, back surface side encapsulant 25b containing an ethylene-vinyl acetate copolymer (EVA) which produces, on hydrolysis, acetic acid causing deterioration of solar cells 22 is reduced in volume. Thus, also from this viewpoint, deterioration due to moisture into solar module 1 can be suppressed.

Thickness T4 of light-receiving surface side encapsulant 25a at the end surface thereof is not so much smaller than thickness T3 of light-receiving surface side encapsulant 25a at the region where solar cells 22 are provided, but thickness T2 of back surface side encapsulant 25b at the end surface thereof is reduced. For this reason, the overall thickness of encapsulant 25 is not so much reduced even at the end surface of solar module 1. Thus, ultraviolet light is hard to reach back surface material 24, which enables suppression of deterioration of back surface material 24 due to ultraviolet light and therefore suppression of aging deterioration of the moisture resistance of solar module 1.

In solar module 1, the concentration of the ultraviolet absorber in light-receiving surface side encapsulant 25a is higher than that in back surface side encapsulant 25b. This enables effective suppression of ultraviolet light reaching back surface material 24. Thus, aging deterioration of the moisture resistance of solar module 1 is further suppressed.

If light-receiving surface material 23 is a rigid body made of glass and back surface material 24 is a flexible body made of a resin sheet, a gap tends to be created between back surface material 24 and frame 11. Thus, the end surface of back surface side encapsulant 25b is likely to contact moisture, so that moisture is likely to enter from the end surface of back surface side encapsulant 25b. Thus, also from this viewpoint, it is effective to reduce thickness T2 of back surface side encapsulant 25b at the end surface thereof.

The magnitude relation between the thickness (T3) of light-receiving surface side encapsulant 25a at the region where solar cells 22 are provided and the thickness (T1) of back surface side encapsulant 25b at the region where solar cells 22 are provided is not particularly limited. T1 and T3 may equal each other, or T1 may be larger than or smaller than T3.

The thickness (T2) of back surface side encapsulant 25b at the end surface thereof is preferably smaller than the thickness (T4) of light-receiving surface side encapsulant 25a at the end surface thereof, or more specifically, T2 is preferably 0.6 or less times as large as T4. Note, however, that too small T2 might increase the ultraviolet permeability of back surface side encapsulant 25b at the end surface thereof, and cause detachment of back surface side encapsulant 25b and back surface material 24 from each other due to lowering of adhesive strength between them. For this reason, T2 is preferably 0.35 or more times as large as T4.

Figure 3:
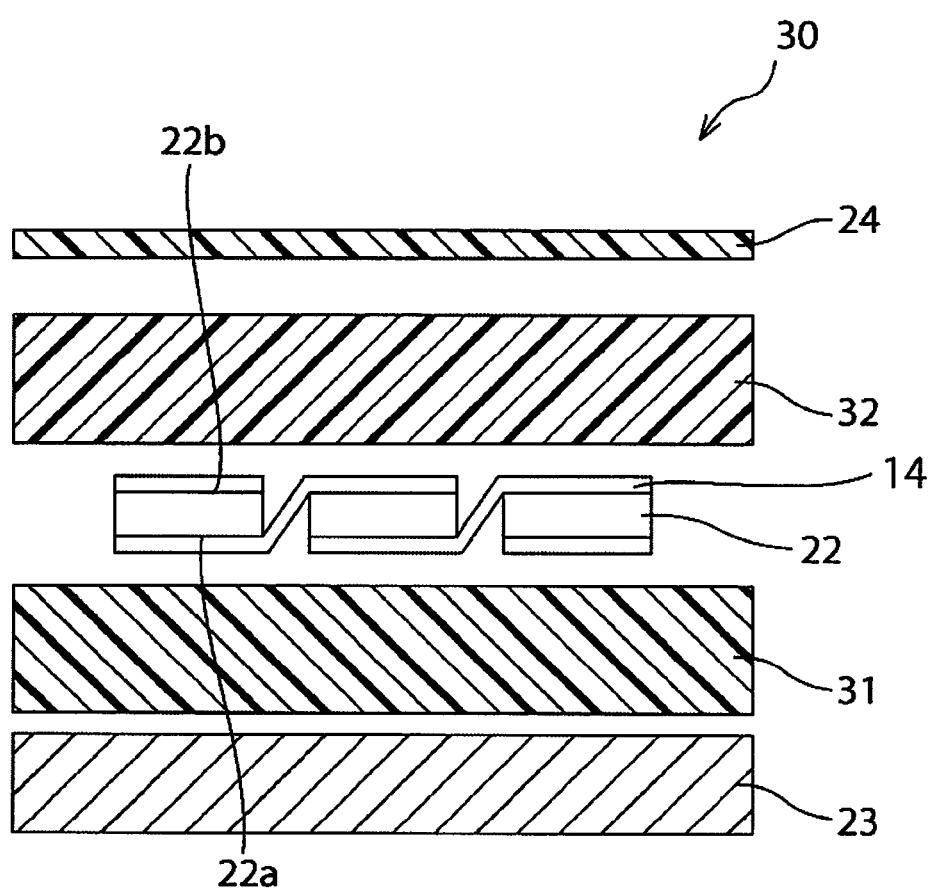
FIG. 3 is a schematic sectional view illustrating steps of manufacturing the solar module according to the embodiment of the invention.

Next, an example of a method of manufacturing solar module 1 is described. As illustrated in FIG. 3, light-receiving surface material 23, first resin sheet 31 for forming light-receiving surface side encapsulant 25a, solar cells 22, second resin sheet 32 for forming back surface side encapsulant 25b, and back surface material 24 are stacked in the order mentioned to form stacked body 30. Next, stacked body 30 is formed into a laminate by being pressed under heat, and thereby solar module 1 is formed (lamination step).

As second resin sheet 32, a resin sheet whose fluidity under the temperature to which stacked body 30 is heated in the lamination step is higher than that of first resin sheet 31 is used. This makes the volume of second resin sheet 32 extrusion between light-receiving surface material 23 and back surface material 24 larger than that of first resin sheet 31 extrusion between light-receiving surface material 23 and back surface material 24. Thus, solar module 1 satisfying (T2/T1)<(T4/T3) can be manufactured.

The invention includes various embodiments that are not described herein. For example, the solar module may have a single solar cell. The back surface side encapsulant may contain dye or pigment such as titania. The back surface material may be made of a resin sheet having a metal layer interposed therein. The frame does not necessarily have to be provided over the entire circumference of the encapsulant. For example, the frame may be provided outside corner portions of the encapsulant. As described above, the invention includes various embodiments not described herein. Hence, the technical scope of the invention should be determined only by the matters specifying the invention in the scope of claims regarded as appropriate based on the description given above.

The invention claimed is:

1. A solar module comprising:
    a solar cell with a light-receiving surface and a back surface; and
    an encapsulant sealing the solar cell, wherein the encapsulant includes
        a light-receiving surface side encapsulant located on a light-receiving surface side of the solar cell, and
        a back surface side encapsulant located on a back surface side of the solar cell, and
    a ratio of a thickness of the back surface side encapsulant at an end surface thereof to a thickness of the back surface side encapsulant at a region where the solar cell is provided ((the thickness of the back surface side encapsulant at the end surface thereof)/(the thickness of the back surface side encapsulant at the region where the solar cell is provided)) is smaller than a ratio of a thickness of the light-receiving surface side encapsulant at an end surface thereof to a thickness of the light-receiving surface side encapsulant at a region where the solar cell is provided ((the thickness of the light-receiving surface side encapsulant at the end surface thereof)/(the thickness of the light-receiving surface side encapsulant at the end surface thereof)),
    further comprising:
    a light-receiving surface material located on the light-receiving surface side of the encapsulant and made of glass; and
    a back surface material located on the back surface side of the encapsulant and made of a resin sheet and wherein the distance between the glass and the resin sheet at a region where the solar cell is provided is larger than the distance between the glass and resin sheet at the end surface and
    wherein water vapor transmission rate of the back surface side encapsulant is higher than that of the light-receiving surface side encapsulant.

2. The solar module according to claim 1, wherein
    the back surface side encapsulant contains a crosslinkable resin, and
    the light-receiving surface side encapsulant contains a non-crosslinkable resin.

3. The solar module according to claim 2, wherein
    the back surface side encapsulant contains an ethylene-vinyl acetate copolymer, and
    the light-receiving surface side encapsulant contains polyolefin.

4. The solar module according to claim 1, wherein
    the encapsulant contains an ultraviolet absorber, and
    a concentration of the ultraviolet absorber in the light-receiving surface side encapsulant is higher than that in the back surface side encapsulant.

5. The solar module according to claim 1, further comprising
    a frame provided outside the encapsulant and including a recessed portion into which the encapsulant is inserted.

6. A method of manufacturing the solar module according to claim 1, the method comprising
    a lamination step of pressing a stacked body under heat to fabricate the solar module, the stacked body being obtained by stacking a first resin sheet for forming the light-receiving surface material, the solar cell, and a second resin sheet for forming the back surface material in the order mentioned, wherein
    a resin sheet used as the second resin sheet is a resin sheet whose fluidity under a temperature to which the laminate is heated in the lamination step is higher than that of the first resin sheet.

* * * * *